(12) United States Patent
Hartmann

(10) Patent No.: US 7,117,414 B2
(45) Date of Patent: Oct. 3, 2006

(54) METHOD FOR IDENTIFYING AN INTEGRATED CIRCUIT

(75) Inventor: Ralf Hartmann, München (DE)

(73) Assignee: Infineon Technologies AG, Munich (DE)

( * ) Notice: Subject to any disclaimer, the term of this patent is extended or adjusted under 35 U.S.C. 154(b) by 328 days.

(21) Appl. No.: 10/127,615

(22) Filed: Apr. 22, 2002

(65) Prior Publication Data

US 2002/0168815 A1 Nov. 14, 2002

Related U.S. Application Data

(63) Continuation of application No. PCT/DE00/03513, filed on Oct. 4, 2000.

(30) Foreign Application Priority Data

Oct. 22, 1999 (DE) ................. 199 51 048

(51) Int. Cl.
G01R 31/28 (2006.01)

(52) U.S. Cl. ................. 714/733; 714/734

(58) Field of Classification Search ........... 714/718, 714/721, 724, 745, 42, 723; 365/158; 324/73.1, 324/433, 764; 340/636
See application file for complete search history.

(56) References Cited

U.S. PATENT DOCUMENTS

| | | | | |
|---|---|---|---|---|
| 3,659,088 A * | 4/1972 | Boisvert, Jr. | ................. | 714/723 |
| 3,664,499 A * | 5/1972 | Sahakian | ................. | 209/573 |
| 4,363,407 A * | 12/1982 | Buckler et al. | ................. | 209/3.3 |
| 4,510,673 A * | 4/1985 | Shils et al. | ................. | 438/15 |
| 5,173,873 A | 12/1992 | Wu et al. | | |
| 5,465,850 A * | 11/1995 | Kase | ................. | 209/573 |
| 5,550,838 A * | 8/1996 | Okajima | ................. | 714/719 |
| 5,640,343 A | 6/1997 | Gallagher et al. | | |
| 5,721,741 A * | 2/1998 | Deas | ................. | 714/724 |
| 5,732,207 A | 3/1998 | Allen et al. | | |
| 5,852,712 A | 12/1998 | Allen et al. | | |
| 5,867,505 A * | 2/1999 | Beffa | ................. | 714/718 |
| 5,986,950 A * | 11/1999 | Joseph | ................. | 365/200 |
| 6,385,081 B1* | 5/2002 | Shiomi | ................. | 365/154 |
| 6,590,818 B1* | 7/2003 | Liston et al. | ................. | 365/201 |

FOREIGN PATENT DOCUMENTS

EP 0 849 675 A2 6/1998

OTHER PUBLICATIONS

J.M. Daughton: "Magnetoresistive memory technology", Thin Solid Films, No. 216, 1992, pp. 162-168.
D.D. Tang et al.: "An IC process compatible Nonvolatile Magnetic RAM", IEDM 95, pp. 997-999.
Zhigang Wang et al.: "A new type of GMR memory", Journal of Magnetism and Magnetic Materials, No. 155, 1996, pp. 161-163.

* cited by examiner

Primary Examiner—Guy Lamarre
Assistant Examiner—Mujtaba K. Chaudry
(74) Attorney, Agent, or Firm—Laurence A. Greenberg; Werner H. Stemer; Ralph E. Locher

(57) ABSTRACT

An identifier is provided for an integrated circuit with a memory composed of a multiplicity of memory cells. The circuit has a manufacture-related memory cell defect pattern formed of defective memory cells. The method of identifying the integrated circuit utilizes the memory cell defect pattern to generate a circuit identification number for identifying the integrated circuit.

14 Claims, 3 Drawing Sheets

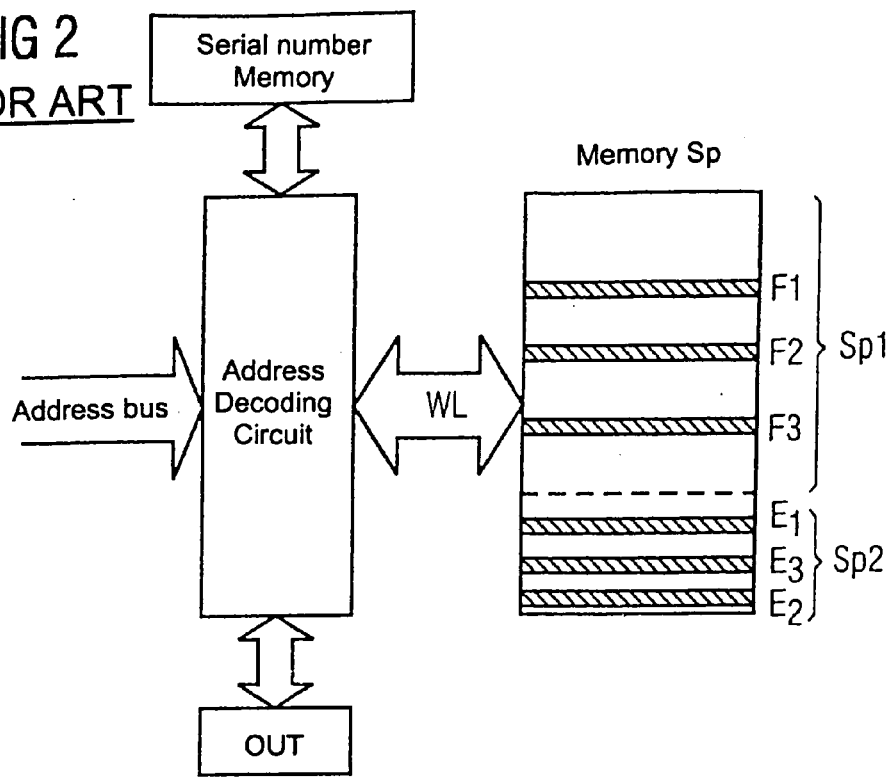
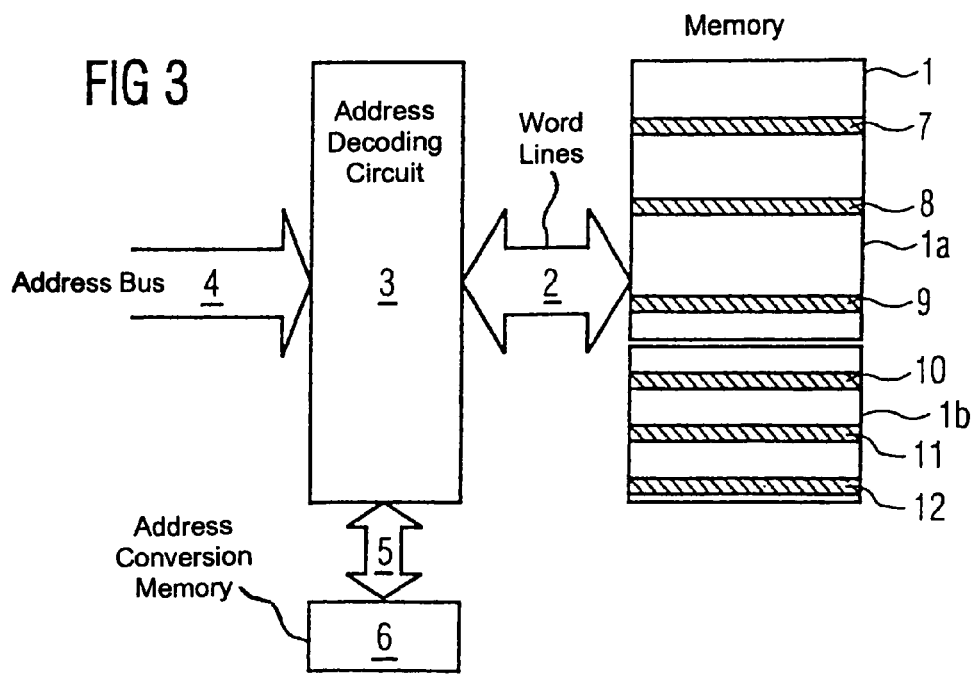

METHOD FOR IDENTIFYING AN INTEGRATED CIRCUIT

CROSS-REFERENCE TO RELATED APPLICATION

This application is a continuation of copending International Application No. PCT/DE00/03513, filed Oct. 4, 2000, which designated the United States.

BACKGROUND OF THE INVENTION

Field of the Invention

The invention relates to a method for identifying an integrated circuit, in particular for linking the integrated circuit to an equipment program.

Semiconductor memories are binary data memories wherein individual memory cells are arranged in a matrix and are composed of semiconductor components.

FIG. 1 shows the basic configuration of a semiconductor memory with various memory cells. The memory cells are connected to word lines WL via an address decoding circuit, and to a write/read amplifier via bit lines. The addressing, i.e. the selection of a memory cell, is carried out by activating the word lines. The information stored in the memory cells is read out by means of a read amplifier or written by means of a write amplifier.

Depending on the type of memory cells, the following memory types are distinguished, namely, memories with random access RAM, with static memory cells SRAM or dynamically chargeable memory cells DRAM. In addition, a distinction is made between read only memories ROM, programmable read only memories PROM, and erasable programmable read only memories EPROM.

In many technical fields of application, it is desirable for a specific piece of equipment software or a specific equipment program to be executable only with a specific piece of hardware. An example of such a technical field is mobile radio technology. In mobile radio technology, the terminals for the connection to customers are subsidized. If a customer opts for a subsidized terminal, he additionally receives from the network operator a network operator software package by means of which the terminal is permanently connected to the network operator. In the field of digital mobile radio networks, this is usually done, for example, by means of the SIM (Subscriber Identifying Module) chip card which is inserted into the terminal. As the terminals are subsidized by the network operator, the telephone costs with the network operator are generally higher in order to compensate for this. By loading a different software package, for example from a non-subsidized terminal, the connection between the terminal and the network operator software can be eliminated. In order to avoid this considerable economic loss, the network operator software is therefore permanently connected to the subsidized terminal or linked to form an executable software package. Pirated software cannot be executed on such a tied terminal.

This has been achieved hitherto in that a serial number has been permanently stored in a non-volatile memory, for example an EEPROM or a flash EPROM memory of an integrated circuit installed in the terminal. The serial number is stored at the manufacturer of the integrated circuit which supplies it to the equipment manufacturer. At the equipment manufacturer, the stored serial number is linked to the software of the equipment manufacturer by way of linking algorithms in such a way that the software of the equipment manufacturer can be executed only together with the integrated circuit that is installed in the equipment.

The serial number for identifying the integrated circuit is not stored in the usual memory area of the integrated circuit but rather in a separate special serial number memory. The reason for this is that memory modules are easily obtainable standard products, so that the lock on the terminal could easily be eliminated by copying a memory of a non-tied piece of equipment and by replacing or reprogramming the memory of a tied piece of equipment. The serial number for identifying the integrated circuit is therefore stored in an unchangeable fashion in its own serial number memory. The serial number is stored, for example, by fusing or by hardwiring the serial number memory after manufacture of the integrated circuit.

When the serial number memory is fused, a logic function of the serial number memory is changed by means of current or laser or this serial number memory is rewired. The storage of a serial number in an independent serial number memory has a number of considerable disadvantages. On the one hand, an independent serial number memory must be integrated in the integrated circuit, as a result of which the manufacturing costs of the integrated circuit are increased. In addition, it is necessary to make available additional production systems which carry out the wiring process of the serial number memory. The procurement of such systems incurs additional costs. Furthermore, the fusing or the programming of the serial number memory to store the serial number lengthens the manufacturing time of the integrated circuit, increasing the production time overall and thus the manufacturing costs.

FIG. 2 shows the circuit structure for identifying an integrated circuit by way of a serial number that is hardwired in a serial number memory, according to the prior art. The address decoding circuit is connected to the address bus of the terminal and addresses, via word lines WL, a memory SP with a first memory area SP1 and a redundant memory area SP2. The memory SP1 is composed of a multiplicity of memory cells SZ, defective memory cells, indicated in FIG. 2 by hatching, which occur during manufacture. The memory area SP2 has a multiplicity of redundant memory cells by which the defective memory cells F1, F2, F3 can be replaced. For this purpose, the address decoding circuit is connected to an address conversion memory AUS. An associated backup memory cell E is stored in the address conversion memory in table form for each defective memory cell F. In addition, the address decoding circuit shown in FIG. 2 is connected to the serial number memory wherein the serial number or identification number of the integrated circuit is stored in hardwired form.

The provision of the serial number memory and the fusing or programming of the serial number memory for storing the serial number of the integrated circuit leads, as stated above, to an increase in the production time and the manufacturing costs of the integrated circuit.

SUMMARY OF THE INVENTION

It is accordingly an object of the invention to provide a method of identifying an integrated circuit, which overcomes the above-mentioned disadvantages of the heretofore-known devices and methods of this general type and which provides for a reliable identification of the integrated circuit and wherein a circuit identification number for identifying the integrated circuit no longer has to be stored in hardwired form in a separate memory.

With the foregoing and other objects in view there is provided, in accordance with the invention, a method of identifying an integrated circuit having a memory formed with a multiplicity of memory cells and having a manufacture-related memory cell defect pattern with defective memory cells, the method which comprises generating a circuit identification number for identifying the integrated circuit from the memory cell defect pattern.

In other words, the invention provides a method for identifying an integrated circuit having a memory which is composed of a multiplicity of memory cells and which has a manufacture-related memory cell defect pattern which is composed of defective memory cells, wherein method a circuit identification number for identifying the integrated circuit is generated as a function of the memory cell defect pattern.

In the method according to the invention, the addresses of the defective memory cells are advantageously acquired and the circuit identification number is generated as a function of the acquired addresses of the defective memory cells.

The circuit identification number is preferably composed of one or more addresses of the defective memory cells.

In accordance with an added feature of the invention, the circuit identification number is formed by linking one or more addresses of the defective memory cells to one another in a mathematical linking operation.

The circuit identification number is preferably read out for linking to an equipment program to form an executable equipment program.

In accordance with an additional feature of the invention, the linked executable program for operating a piece of equipment is stored in a program memory area.

The addresses of any defective memory cell are diverted in each case to an address of a backup memory cell in a redundant memory area of the memory.

In accordance with another feature of the invention, for each address of a defective memory cell, in each case the address of an associated backup memory cell is stored in an address conversion memory as an address table.

In accordance with a further feature of the invention, the addresses of the defective memory cell are acquired once after manufacture of the integrated circuit in a manufacturer test operation and are permanently stored with the addresses of the associated backup memory cells in the address conversion memory for address diversion.

In accordance with a preferred embodiment of the method according to the invention, the addresses of the defective memory cells are acquired in a self test whenever the integrated circuit is switched on and are stored with the addresses of the associated backup memory cells in the address conversion memory for address diversion.

The circuit identification number is preferably generated as a function of the addresses, acquired in the self test, of the defective memory cells and is compared with the linked original circuit identification number by the equipment program, the equipment program enabling the associated piece of equipment if the circuit identification number generated in accordance with the self test is identical to the original circuit identification number.

Other features which are considered as characteristic for the invention are set forth in the appended claims.

Although the invention is illustrated and described herein as embodied in a method for identifying an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block diagram of the address decoding within an integrated circuit for identifying it by way of a serial number stored in a serial number memory, according to the prior art;

FIG. 3 is a similar block diagram showing the address decoding within an integrated circuit for identifying it by way of the method according to the invention.

DESCRIPTION OF THE PREFERRED EMBODIMENTS

Figure 1:
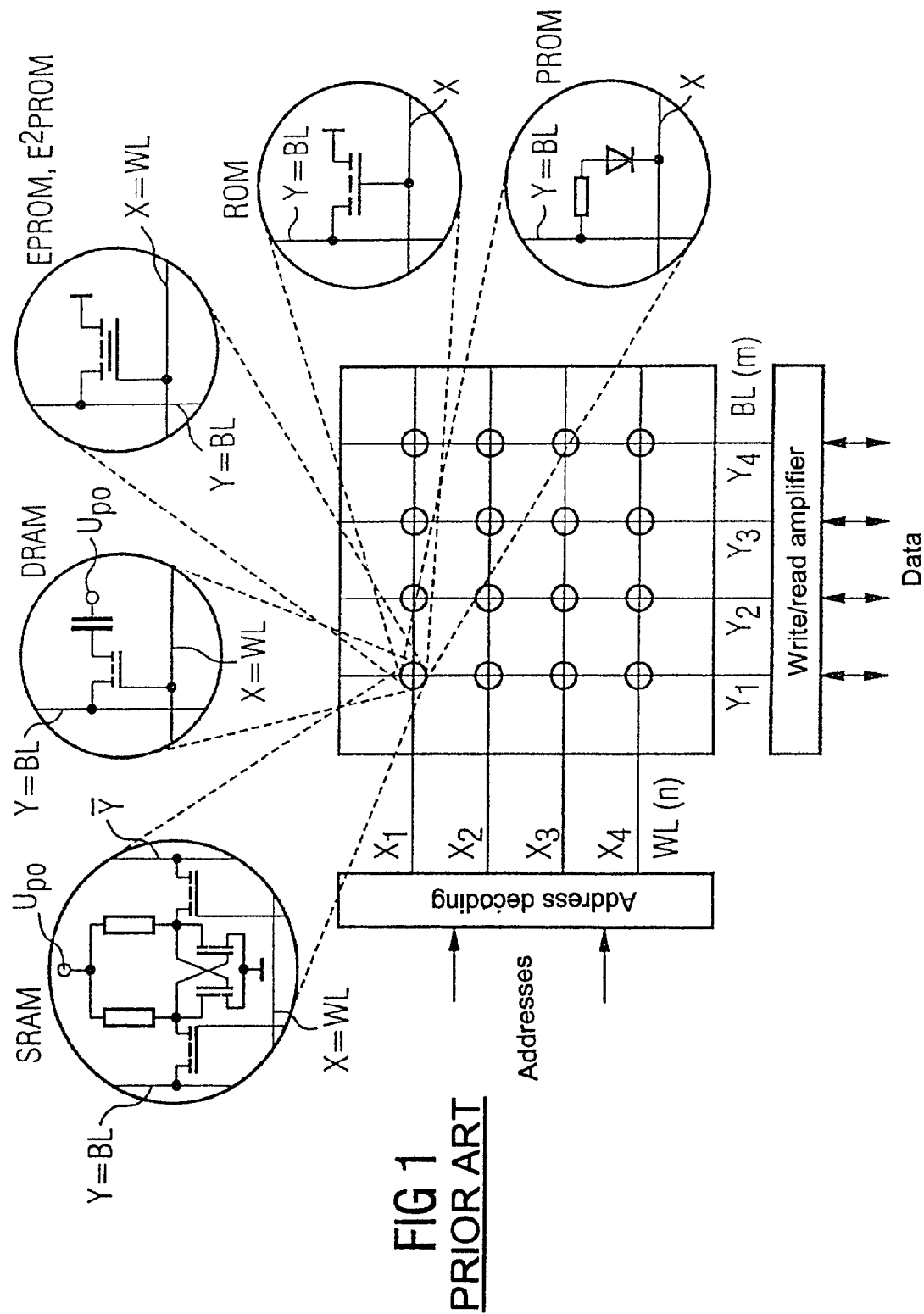
FIG. 1 is a schematic diagram of a principal circuit structure of a semiconductor memory with various memory cells according to the prior art.

Referring now once more to the figures of the drawing in detail and, particularly, to FIG. 3 thereof, there is shown the memory addressing of an integrated circuit for carrying out the method according to the invention for identifying this integrated circuit. The integrated circuit contains a memory 1, preferably a semiconductor memory. The memory 1 is composed of two memory areas, namely a usual memory area 1a which can be addressed primarily, and a redundant memory area 1b. The memory 1 is connected to an address decoding circuit 3 via a plurality of word lines 2. An address bus 4 of the integrated circuit is connected to the address decoding circuit 3. In addition, the address decoding circuit 3 is connected via lines 5 to an address conversion memory 6. In the usual memory area 1a, defective memory cells, for example three defective memory cells 7, 8, 9, occur for production-related reasons. In the address conversion memory 6, in each case an address of an associated backup memory cell 10, 11, 12 is stored in the redundant memory area 1b for each address of one of the defective memory cells 7, 8, 9 in the memory area 1a. Here, an address table is created in the address conversion memory, wherein table in each case an associated backup memory cell 10, 11, 12 is stored for each address of a memory cell 7, 8, 9 which is recognized as being defective. If the address of a defective memory cell is applied to the address decoding circuit 3 via the address bus 4, the address decoding circuit 3 diverts this address to the address of the associated redundant backup memory cell in the redundant memory area 1b of the memory 1 after accessing the address conversion memory 6.

The address conversion is either implemented during the actual manufacturing process of the integrated circuit by fusing or hardwiring the address conversion memory in the integrated circuit, or the address conversion memory is reprogrammed once more by means of the memory access after carrying out a self test whenever the integrated circuit is switched on.

During the implementation of the address conversion during the manufacturing process, the addresses of the defective memory cells 7, 8, 9 in the usual memory area are acquired once in a test carried out by the manufacturer after the manufacture of the integrated circuit and are permanently stored or fused with the addresses of assigned backup memory cells 10, 11, 12 in the address conversion memory 6 for address diversion.

If, when the integrated circuit is switched on, a self test of the memory takes place, the addresses of the defective memory cells 7, 8, 9 are acquired in a self test whenever the integrated circuit is switched on and stored with an address of an assigned backup memory cell 10, 11, 12 in the address conversion memory 6 for address diversion.

The defective memory cells 7, 8, 9 in the memory area 1a of the memory 1 form a characterizing memory cell defect pattern for characterizing the memory 1 contained in the integrated circuit. During the manufacture of the integrated circuit with large integrated memories 1, i.e. memories with a multiplicity of memory cells, manufacturing defects occur in the memories owing to the multiplicity of memory cells. So that the integrated circuit can still be used, the redundant memory area 1b is provided which is addressed by means of address conversion. The frequency of the occurrence of defective memory cells 7, 8, 9 rises as the memory area 1a increases in size. At the same time, the frequency of defective memory cells rises as the sensitivity of the manufacturing process increases, in particular when there is an increasing degree of miniaturization in the integration of the memory.

In the currently smallest memory size of 128 kB which is used in GSM applications, the addresses of the memory cells have a length of 17 bits. It is thus possible to distinguish $2^{17}$ different defective integrated circuits. As the size of the memory increases, the statistical probability that no memory cell in the memory area 1a is defective decreases. With the memories which are usually employed and the manufacturing technologies which are currently used, the probability of no defective memory cell occurring in the memory area 1a is very low. A memory area 1a without a single defective memory cell thus also has a defect pattern which is characteristic of it, specifically the particular defect pattern that there is not a single defective memory cell.

The defective memory cells occurring in the memory area 1a act like a fingerprint of the memory 1, and thus also of the integrated circuit wherein the memory 1 is contained.

In the method according to the invention for identifying an integrated circuit, the memory cell defect pattern which is formed from the defective memory cells is used to generate a circuit identification number for identifying the integrated circuit. The circuit identification number of the integrated circuit is generated here preferably as a function of the addresses of the defective memory cells 7, 8, 9.

Here, the characterizing circuit identification number of the integrated circuit can be composed of one or more addresses of the defective memory cells 7, 8, 9 themselves. Alternatively, the circuit identification number is formed by mathematically linking a plurality of addresses of the defective memory cells 7, 8, 9, in a computational operation. The calculation rule which is necessary for this is preferably stored in a program memory area of the memory 1.

As is apparent from FIG. 3, there is no need for an independent serial number memory or circuit identification number memory for storing the circuit identification number.

The circuit identification number which is generated is read out for linking to an equipment program to form an executable equipment program. For this purpose, an equipment manufacturer in whose equipment the manufactured integrated circuit is installed receives, from the manufacturer of the integrated circuit, a reading-out program for reading out the circuit identification number. The equipment manufacturer, which, for example, manufactures mobile telephones or computers, executes the reading-out program in the integrated circuit in order to read out the circuit identification number and links the read-out circuit identification number to its original software to form an executable equipment software package. The equipment with the executable equipment software package is supplied to the end users by the equipment manufacturer.

Figure 4:
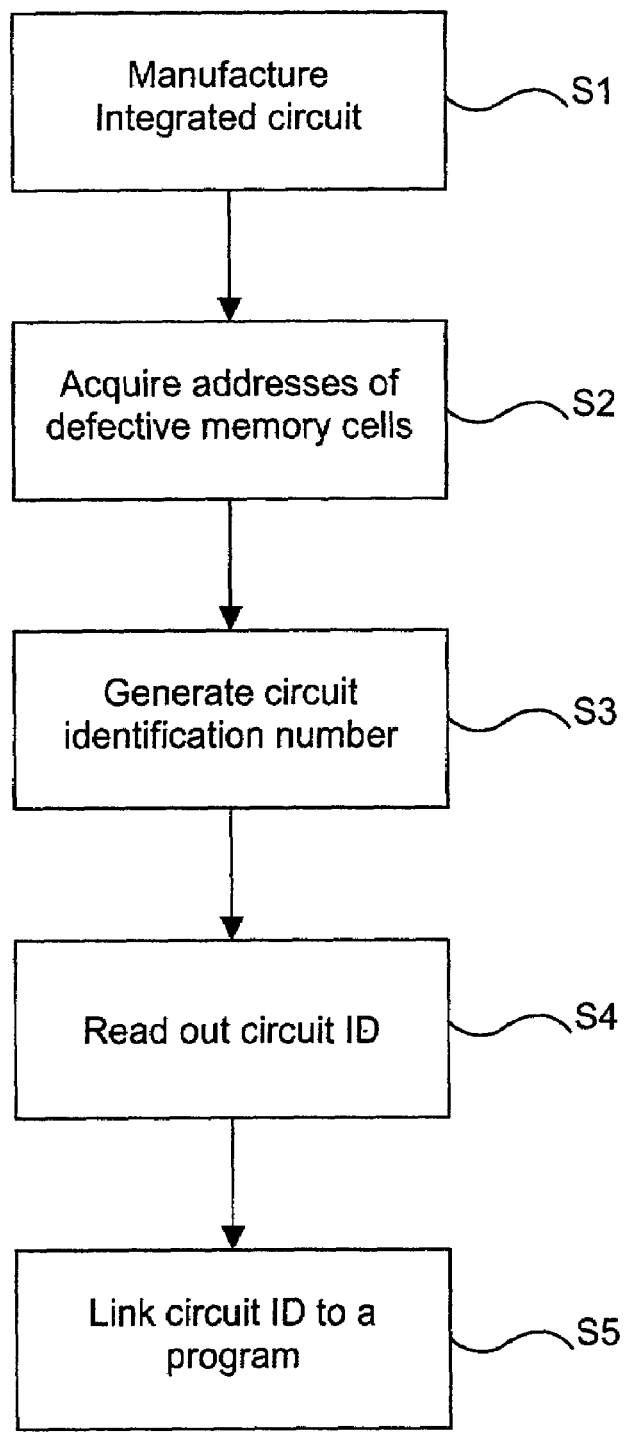
FIG. 4 is a flowchart illustrating the method according to the invention.

FIG. 4 shows a flowchart of the individual steps which are carried out until the original software is linked to the circuit identification number.

In a step S1, the integrated circuit is manufactured with a manufacture-related memory cell defect pattern.

Then, in a step S2, the addresses of the defective memory cells are acquired.

In a step S3, a circuit identification number is generated for the integrated circuit as a function of the acquired addresses of the defective memory cells.

The generated circuit identification number is read out in a step S4 by the equipment manufacturer by means of a read-out program which is accessible to them.

In a step S5, the circuit identification number is linked, at the equipment manufacturer's, to an original equipment program to form an equipment program which can be executed on the equipment.

The equipment is then supplied to the customer for use.

During use by the customer, a self test is preferably carried out whenever the equipment is switched on and defective addresses are diverted via address lines. The circuit identification number is generated as a function of the addresses, acquired in the self test, of the defective memory cells and compared with the linked, original circuit identification number by the equipment program. The equipment program enables the associated equipment if the circuit identification number generated after the self test is identical to the original circuit identification number. A "pirated" software package runs on the terminal only if the integrated circuit in the device from which the software originates has an identical memory cell defect pattern to that of the integrated circuit from that piece of equipment into which the software is to be copied. The probability of this is extremely low and tends toward zero. The method according to the invention is then already sufficiently secure if the memory area 1a only has a single defective memory cell.

In the method according to the invention, hardwiring of the serial number is no longer necessary in a separate serial number memory area.

If, in addition, a self test is carried out in the terminal when the integrated circuit is switched on, it is also the case that hardwiring of the address conversion memory 6 is no longer necessary. In this case, the fusing or programming of the integrated circuit is dispensed with entirely. As a result, on the one hand, the production time which is additionally required as a result of the hardwiring is avoided and in addition, there is no need for a system for carrying out the hardwiring or the fusing process. As a result, the manufacturing costs of the integrated circuit are considerably reduced overall. Furthermore, the method according to the invention provides an extremely reliable way of identifying the integrated circuit.

The method according to the invention for identifying an integrated circuit can be used in various ways, in particular in all areas wherein an original software package of the equipment manufacturer is linked to an integrated circuit manufactured by a memory manufacturer. Typical areas are PC applications and mobile telephones here.

The method according to the invention can be used particularly advantageously in integrated circuits which do not have non-volatile, programmable memory areas, such as PROM or flash EPROM.

The method according to the invention is suitable in particular for identifying integrated circuits with SRAM or DRAM memories contained in them.

The method according to the invention can be expanded to the effect that the memory cell defect pattern is actively generated in the manufacturing process. In a random process, random memory cell addresses are generated and the associated memory cells are wherein as defective or are damaged.

I claim:

1. A method for identifying an integrated circuit having a memory including a multiplicity of memory cells and having a manufacture-related memory cell defect pattern including defective memory cells, the integrated circuit performing a self test when switched on, the method comprising:
   acquiring addresses of defective memory cells from the self test of the integrated circuit;
   generating a circuit identification number as a function of the addresses of defective memory cells for identifying the integrated circuit; and
   comparing the circuit identification number with an original circuit identification number by an equipment program, the original circuit identification number being generated in a manufacturer test operation, the equipment program enabling a piece of equipment containing the integrated circuit if the circuit identification number generated in accordance with the self test is identical to the original circuit identification number.

2. The method according to claim 1, wherein the circuit identification number is read out for linking to an equipment program to form an executable equipment program.

3. The method according to claim 2, wherein the linked executable equipment program is stored in a program memory area in order to operate a piece of equipment.

4. The method according to claim 1, wherein the address of any defective memory cell is diverted in each case to an address of a backup memory cell in a redundant memory area of the memory.

5. The method according to claim 1, wherein, for each address of a defective memory cell, in each case an address of an associated backup memory cell is stored in an address conversion memory as an address table.

6. The method according to claim 1, wherein the addresses of the defective memory cells are acquired once after manufacture of the integrated circuit in a manufacturer test and are permanently stored with the addresses of the associated backup memory cells in an address conversion memory for address diversion.

7. The method according to claim 1, wherein the addresses of the defective memory cells are acquired in a self test whenever the integrated circuit is switched on and are stored with the addresses of the associated backup memory cells in the address conversion memory for address diversion.

8. The method according to claim 7, wherein the circuit identification number is generated as a function of the addresses, acquired in the self test, of the defective memory cells and is compared with the linked original circuit identification number by the equipment program, the equipment program enabling the associated piece of equipment if the circuit identification number generated in accordance with the self test is identical to the original circuit identification number.

9. The method according to claim 1, wherein the circuit identification number is formed from one or more addresses of the defective memory cells.

10. The method according to claim 1, wherein the circuit identification number is generated by linking a plurality of addresses of the defective memory cells in a calculation operation for generating the circuit identification number.

11. A method for generating a circuit identification for identifying an integrated circuit having a memory including a multiplicity of memory cells and including a manufacture-related memory cell defect pattern including defective memory cells, the method comprising:
    acquiring addresses of defective memory cells from a self test on the integrated circuit;
    generating a circuit identification number as a function of the addresses of defective memory cells for identifying the integrated circuit; and
    permanently storing the addresses of the defective memory cells with addresses of the associated backup memory cells in an address conversion memory of the integrated circuit for address diversion, the addresses of the defective memory cells identifying the integrated circuit.

12. The method according to claim 11, further comprising:
    generating a circuit identification number for the integrated circuit as a function of the acquired addresses of the defective memory cells;
    reading out the circuit identification number by a read-out program; and
    linking the circuit identification number to an original equipment program to form an equipment program to be executed on the equipment.

13. The method according to claim 11, wherein, for each address of a defective memory cell, in each case the address of an associated backup memory cell is stored in an address conversion memory as an address table.

14. An integrated circuit identification method comprising the steps of:
    providing an integrated circuit having a memory, including a multiplicity of memory cells and a manufacture-related memory cell defect pattern including defective memory cells;
    performing a self test on the integrated circuit when switching on the integrated circuit for acquiring addresses of defective memory cells; and
    generating a circuit identification number as a function of the addresses of defective memory cells for identifying the integrated circuit.

* * * * *